United States Patent
Wu et al.

(10) Patent No.: US 12,408,501 B2
(45) Date of Patent: Sep. 2, 2025

(54) MICRO-LIGHT-EMITTING DIODE DISPLAY PANEL

(71) Applicant: Prilit Optronics, Inc., Tainan (TW)

(72) Inventors: Biing-Seng Wu, Tainan (TW); Hsing-Ying Lee, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 623 days.

(21) Appl. No.: 17/687,423

(22) Filed: Mar. 4, 2022

(65) Prior Publication Data

US 2023/0130193 A1    Apr. 27, 2023

Related U.S. Application Data

(60) Provisional application No. 63/270,164, filed on Oct. 21, 2021.

(51) Int. Cl.
*H10H 20/857* (2025.01)
*H01L 21/66* (2006.01)
*H01L 25/075* (2006.01)
*H10H 20/851* (2025.01)

(52) U.S. Cl.
CPC ........... *H10H 20/857* (2025.01); *H01L 22/32* (2013.01); *H01L 25/0753* (2013.01); *H10H 20/8512* (2025.01)

(58) Field of Classification Search
CPC ..... H01L 33/62; H01L 22/32; H01L 25/0753; H01L 33/502; H01L 2933/0066; H01L 25/03; H01L 25/13; H01L 25/167; H01L 22/00; H01L 22/34; H01L 22/12; H01L 2924/12041; G09G 3/006; G09G 3/32; G09G 3/3225; G09G 3/3258; G09G 3/325; G09G 3/3241; G09G 3/3233; G09G 3/2074; G09G 2300/0426; G09G 2330/12; H10H 20/857; H10H 20/8512; H10H 20/0364; G02F 1/136254

See application file for complete search history.

(56) References Cited

U.S. PATENT DOCUMENTS

| | | | |
|---|---|---|---|
| 2013/0038806 A1* | 2/2013 | Tae | H01L 22/32 257/E21.531 |
| 2017/0205956 A1* | 7/2017 | Li | G02F 1/1309 |
| 2019/0378770 A1* | 12/2019 | Iguchi | H01L 27/156 |

* cited by examiner

*Primary Examiner* — Sue A Purvis
*Assistant Examiner* — Raj Gupta
(74) *Attorney, Agent, or Firm* — Donald E. Stout; Stout, Uxa & Buyan, LLP

(57) ABSTRACT

A micro-light-emitting diode (microLED) display panel includes microLEDs disposed on a display area, which is divided into a plurality of blocks; drivers respectively disposed on the blocks; and probe pads disposed within each block, the probe pads being electrically connected to corresponding microLEDs via corresponding electric wires. The probe pads and the electric wires of a corresponding block are disposed locally and confined to the corresponding block, and are not connected elsewhere beyond the corresponding block.

12 Claims, 6 Drawing Sheets

MICRO-LIGHT-EMITTING DIODE DISPLAY PANEL

CROSS-REFERENCE TO RELATED APPLICATIONS

This application claims the benefit of U.S. Provisional Application No. 63/270,164, filed on Oct. 21, 2021, the entire content of which is hereby incorporated by reference.

BACKGROUND OF THE INVENTION

1. Field of the Invention

The present invention generally relates to a micro-light-emitting diode (microLED) display panel, and more particularly to a microLED display panel with local probe pads.

2. Description of Related Art

A micro-light-emitting diode (microLED, mLED or µLED) display panel is one of flat display panels, and is composed of microscopic microLEDs each having a size of 1-100 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

As microLEDs are individually transferred to and bonded on a glass substrate to form a display panel, defects may sometimes occur and repairs should be carried out to correct them. Therefore, detection becomes indispensable to manufacturing the microLED display panels.

Probe pads are conventionally set on peripheral areas on the display panels for performing detection on the bonded microLEDs. However, the microLEDs may probably be overdriven or under driven due to impedance being increased along electric wires. Further, it is ordinarily difficult to identify locations of abnormality due to large amount of microLEDs under detection being electrically connected.

A need has thus arisen to propose a novel scheme to overcome drawbacks of detecting conventional microLED display panels.

SUMMARY OF THE INVENTION

In view of the foregoing, it is an object of the embodiment of the present invention to provide a microLED display panel with locally disposed probe pads facilitating independent detections on local areas respectively, thereby effectively enhancing performance of detection and repairing.

According to one embodiment, a micro-light-emitting diode (microLED) display panel includes microLEDs, drivers and probe pads. The microLEDs are disposed on a display area, which is divided into a plurality of blocks. The drivers are respectively disposed on the blocks. The probe pads are disposed within each block, the probe pads being electrically connected to corresponding microLEDs via corresponding electric wires. The probe pads and the electric wires of a corresponding block are disposed locally and confined to the corresponding block, and are not connected elsewhere beyond the corresponding block.

DETAILED DESCRIPTION OF THE INVENTION

Figure 1:
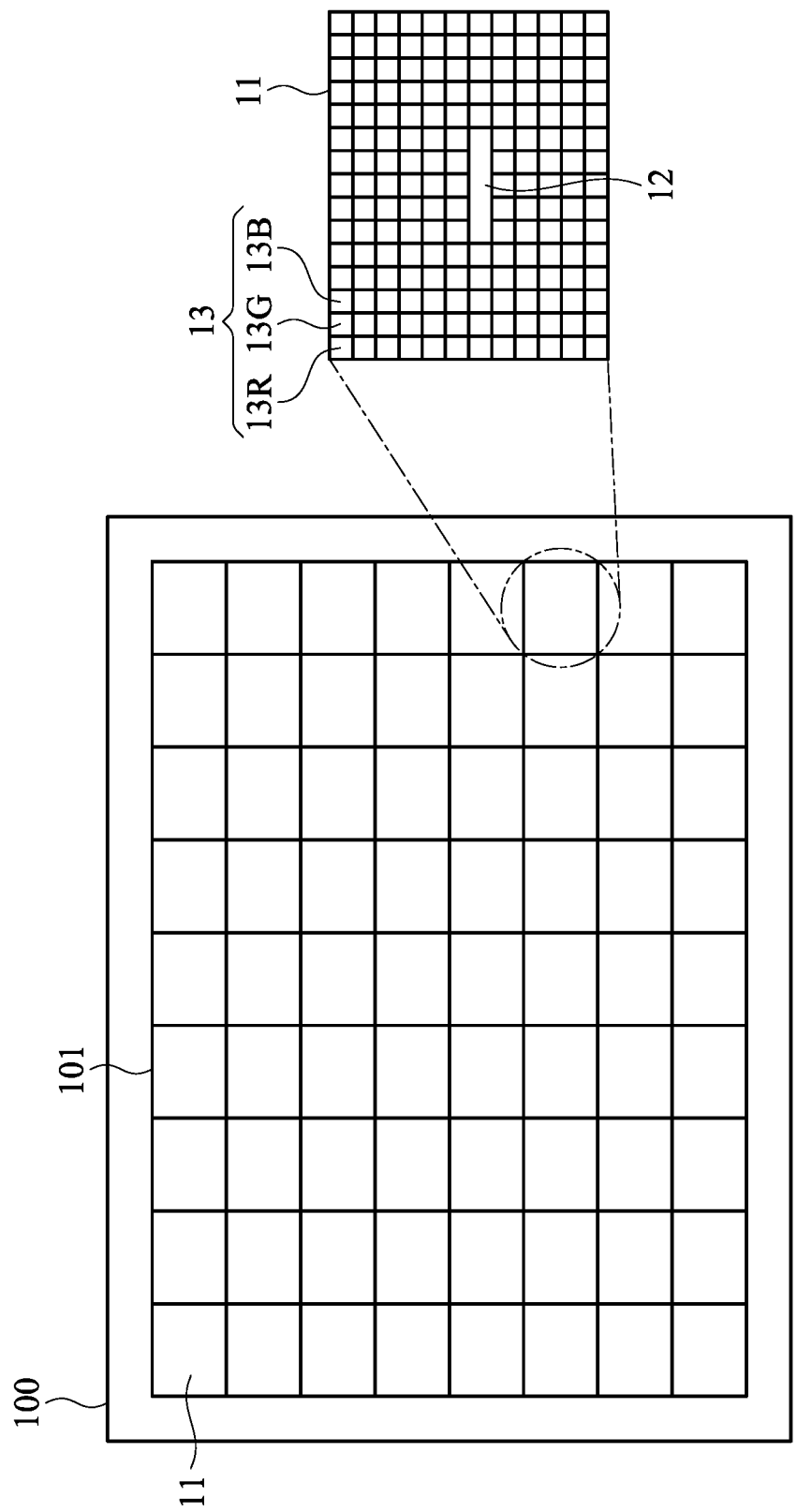
FIG. 1 shows a schematic diagram illustrating a top view of a micro-light-emitting diode (microLED) display panel according to one embodiment of the present invention.

FIG. 1 shows a schematic diagram illustrating a top view of a micro-light-emitting diode (microLED) display panel 100 according to one embodiment of the present invention. Specifically, the microLED display panel 100 may include a display area 101 that is arranged within a perimeter of the microLED display panel 100. Accordingly, an area between the perimeter of the microLED display 100 and the display area 101 represents a non-display area (or periphery area).

In the embodiment, the display area 101 may be divided into a plurality of blocks 11, and each block 11 may have a corresponding driver 12 for driving corresponding microLEDs 13, for example, red microLEDs 13R, green microLEDs 13G and blue microLEDs 13B, as demonstrated in the magnified view of a block 11 in FIG. 1. It is noted that, in the specification, the division among the blocks 11 indicates arranging areas for corresponding blocks 11, instead of physically cutting the microLED display panel 100 and physically separating the blocks 11 from each other. The microLED display panel 100 of the embodiment may be, but not limited to, a full-color display panel. It is appreciated that the microLEDs need not be red microLEDs 13R, green microLEDs 13G and blue microLEDs 13B inherently. Instead, for example, the microLEDs may be inherently monochrome but can emit color light by adding fluorescent powder or quantum dots.

Figure 2:
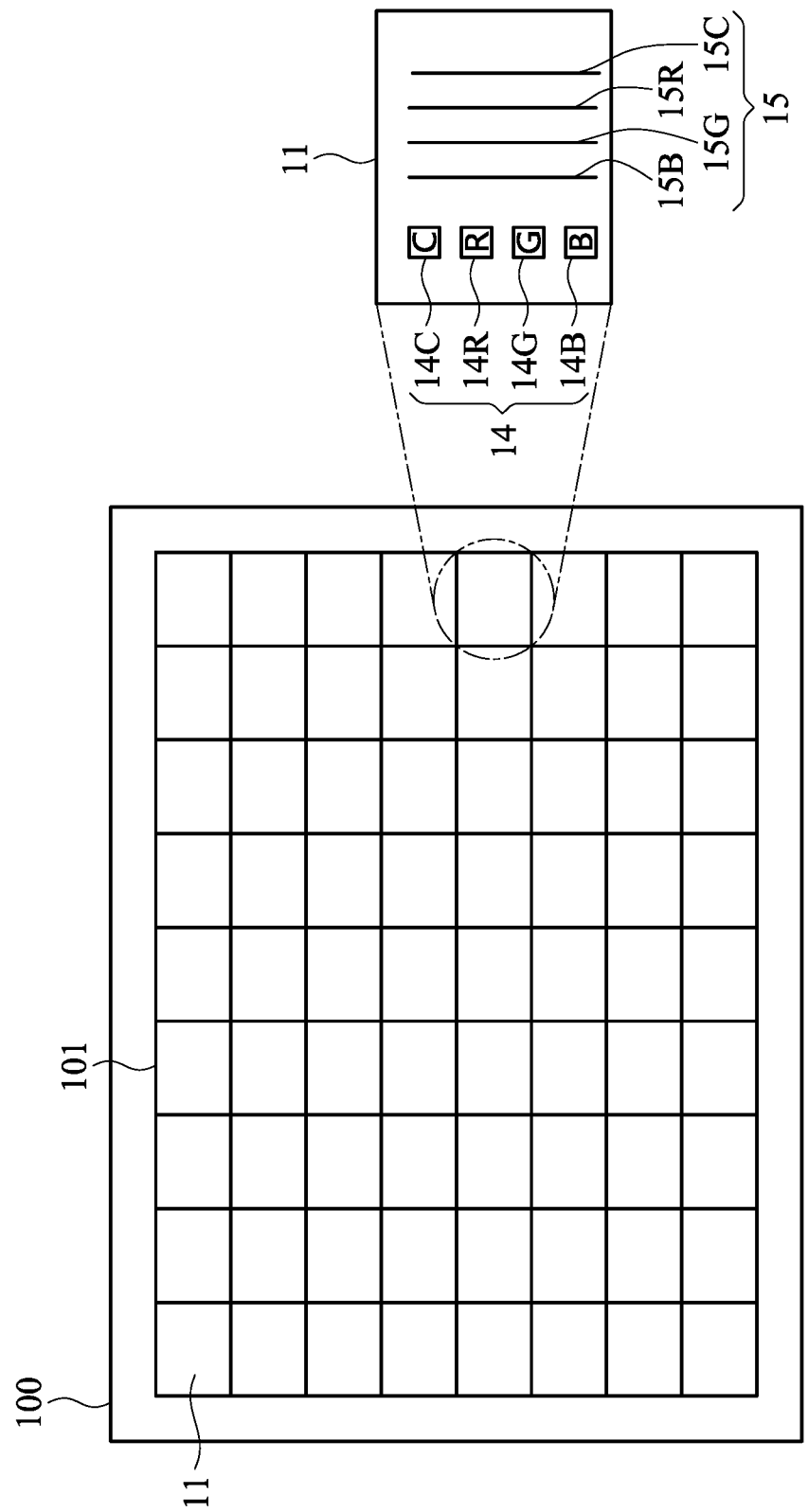
FIG. 2 shows a schematic diagram illustrating a top view of the microLED display panel with an enlarged block with details according to one embodiment of the present invention.

FIG. 2 shows a schematic diagram illustrating a top view of the microLED display panel 100 with an enlarged block 11 with details according to one embodiment of the present invention. According to one aspect of the embodiment, each block 11 may include a plurality of (local) probe pads 14, for example, a reference probe pad 14C, a red probe pad 14R, a green probe pad 14G and a blue probe pad 14B, which are disposed on the corresponding block 11. Each block 11 may include a plurality of (local) electric wires 15, for example, a reference electric wire 15C, a red electric wire 15R, a green electric wire 15G and a blue electric wire 15B, which are disposed on the corresponding block 11. In each block 11, the probe pads 14 are electrically connected to corresponding microLEDs (not shown) via corresponding electric wires 15. Accordingly, after bonding microLEDs on the block 11 of the display area 101, detection may be performed on the microLEDs of the block 11 by providing or receiving signals (or voltages) to or from the probe pads 14. For example, a reference voltage Vcom may be provided to or received from the reference probe pads 14C, and a color (e.g., red, green or blue) signal may be provided to or received from the (red, green or blue) probe pad (14R/14G/14B). Repairs may be executed afterward if abnormality is detected.

It is appreciated that the probe pads 14 (of each block 11) may be disposed (or located) in a variety of places. For example, the probe pads 14 may be disposed on an edge of (but within) the block 11, or be disposed on one or two sides of the driver 12. The probe pads 14 (of each block 11) may be arranged in a variety of ways. For example, the probe pads 14 may be arranged laterally, longitudinally or individually (or separately).

According to another aspect of the embodiment, the probe pads 14 and electric wires 15 of a corresponding block 11 are disposed locally, that is, confined to the corresponding block 11, and are not connected elsewhere beyond the corresponding block 11. Therefore, detection performed on one block 11 could not affect or be affected by other blocks 11. Furthermore, locations of abnormality may be definitely identified with certainty. After finishing the detection (and repair, if required) of one block 11, connection between the probe pads 14 and the microLEDs 13 of that block 11 may be permanently severed, for example, by physically cutting (for example, by laser).

Figure 3A:
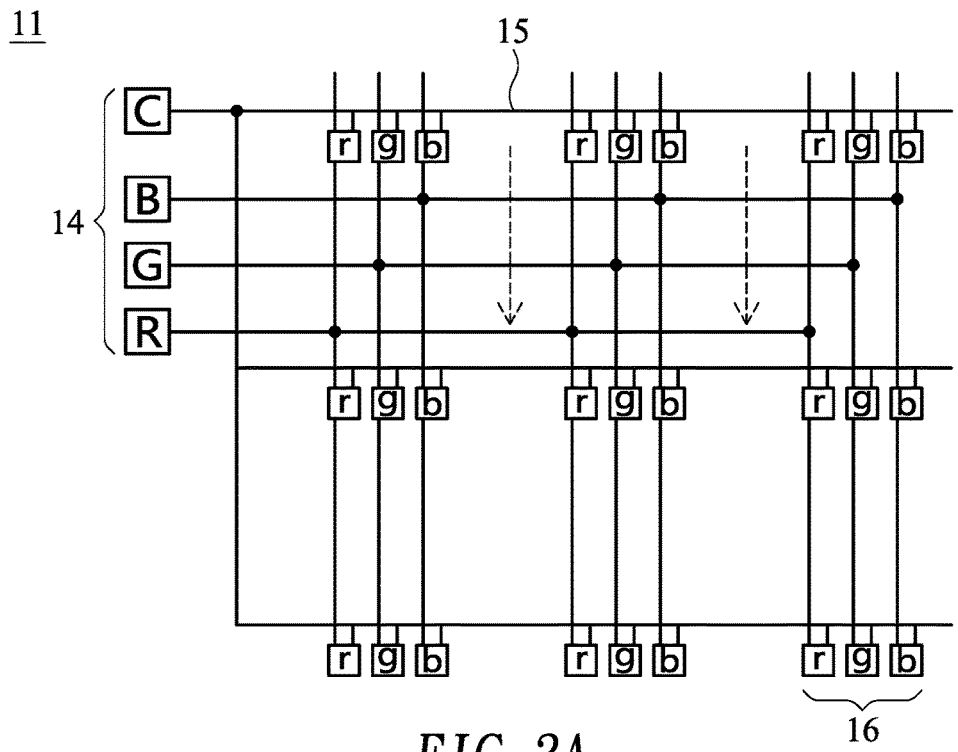
FIG. 3A shows a simplified schematic diagram illustrating a top view of a block according to a first exemplary embodiment of the present invention.

FIG. 3A shows a simplified schematic diagram illustrating a top view of a block 11 according to a first exemplary embodiment of the present invention. In the embodiment, the probe pads 14 are disposed on an edge of the block 11. Specifically, same-color bonding pads 16 (for bonding with the microLEDs 13) at same columns are electrically connected (via longitudinal electric wires 15), respectively. Next, each column is electrically connected to a corresponding probe pad 14 (via a lateral electric wire 15). After finishing the detection (and repair, if required) of one block 11, connection between the probe pads 14 and the microLEDs 13 of the block 11 may be permanently severed, for example, by physically cutting (for example, by laser) as denoted by the dashed arrows. The amount of cuttings is equal to the resolution of the microLED display panel 100.

Figure 3B:
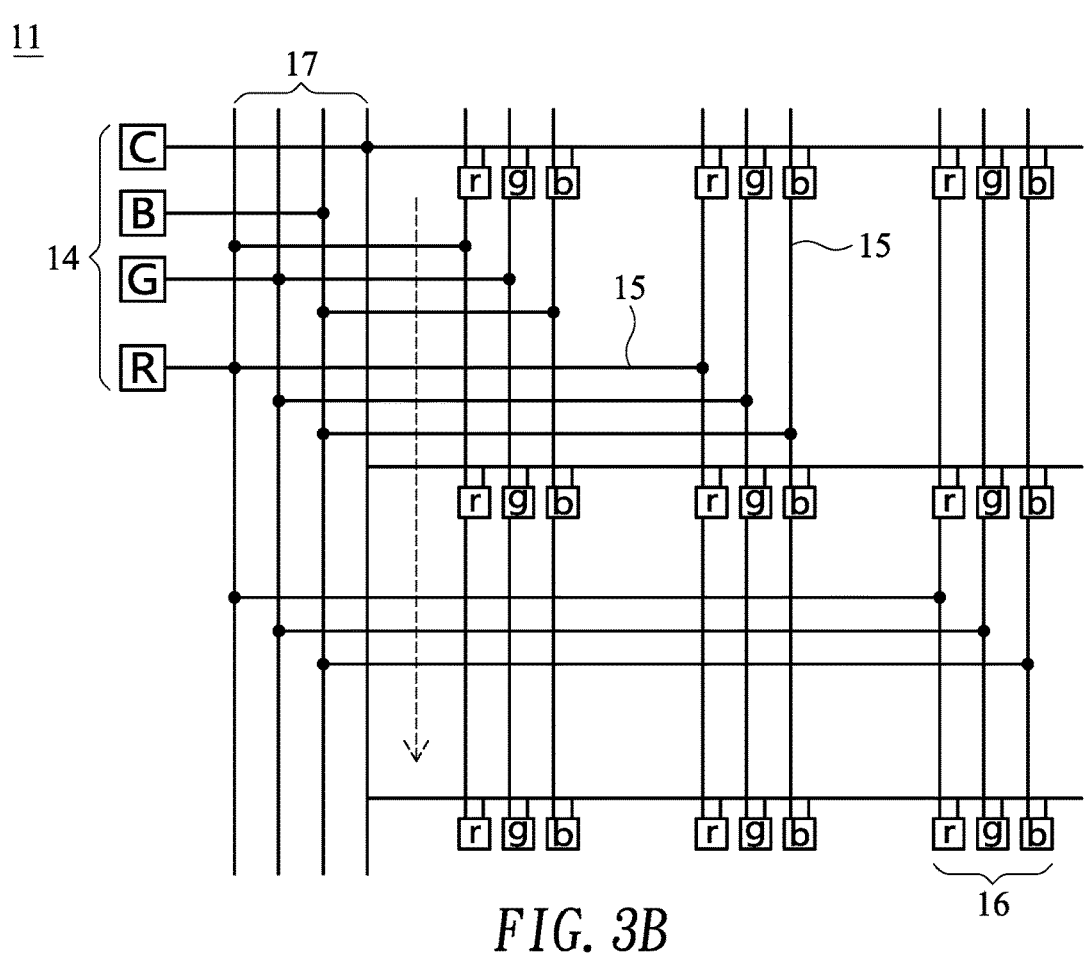
FIG. 3B shows a simplified schematic diagram illustrating a top view of a block according to a second exemplary embodiment of the present invention.

FIG. 3B shows a simplified schematic diagram illustrating a top view of a block 11 according to a second exemplary embodiment of the present invention. In the embodiment, the probe pads 14 are disposed on an edge of the block 11. Specifically, same-color bonding pads 16 at same columns are electrically connected (via longitudinal electric wires 15), respectively. Next, each column is electrically connected to a corresponding (longitudinal) compiling wire 17 (via a lateral electric wire 15). In the embodiment, there are totally four compiling wires 17, that is, a reference compiling wire, a red compiling wire, a green compiling wire and a blue compiling wire. The compiling wires 17 are then electrically connected to corresponding probe pads 14 respectively. After finishing the detection (and repair, if required) of one block 11, connection between the probe pads 14 and the microLEDs 13 of the block 11 may be permanently severed, for example, by physically cutting (for example, by laser) as denoted by the dashed arrows. The amount of cuttings is equal to the number of the blocks 11 in the microLED display panel 100.

Figure 3C:
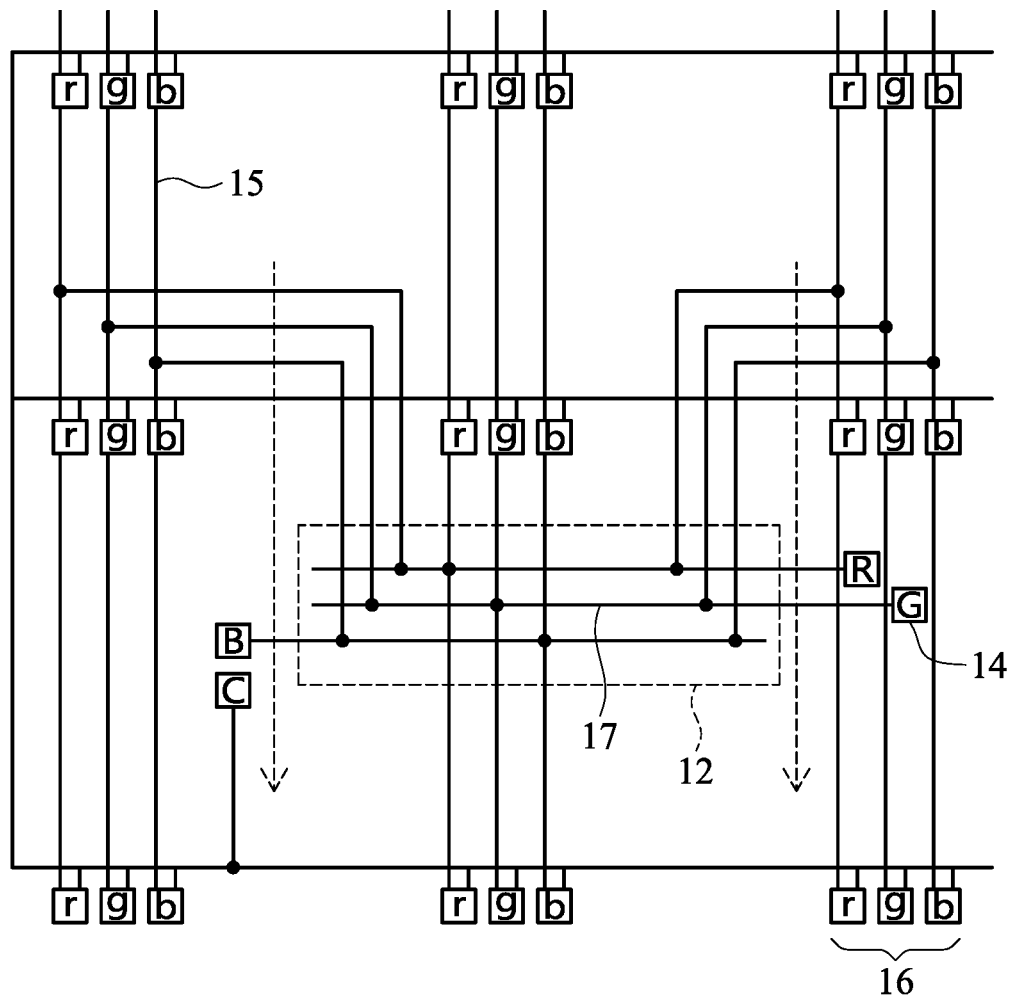
FIG. 3C shows a simplified schematic diagram illustrating a top view of a block according to a third exemplary embodiment of the present invention.

FIG. 3C shows a simplified schematic diagram illustrating a top view of a block 11 according to a third exemplary embodiment of the present invention. In the embodiment, the probe pads 14 are disposed on sides of the driver 12. Specifically, same-color bonding pads 16 (for bonding with the microLEDs 13) at same columns are electrically connected (via longitudinal electric wires 15), respectively. Next, each column is electrically connected to a corresponding (lateral) compiling wire 17. In the embodiment, there are totally three compiling wires 17, that is, a red compiling wire, a green compiling wire and a blue compiling wire. The compiling wires 17 are then electrically connected to corresponding probe pads 14 respectively. After finishing the detection (and repair, if required) of one block 11, connection between the probe pads 14 and the microLEDs 13 of the block 11 may be permanently severed, for example, by physically cutting (for example, by laser) as denoted by the dashed arrows. The amount of cuttings is at least two times the number of the blocks 11 in the microLED display panel 100.

Figure 4A:
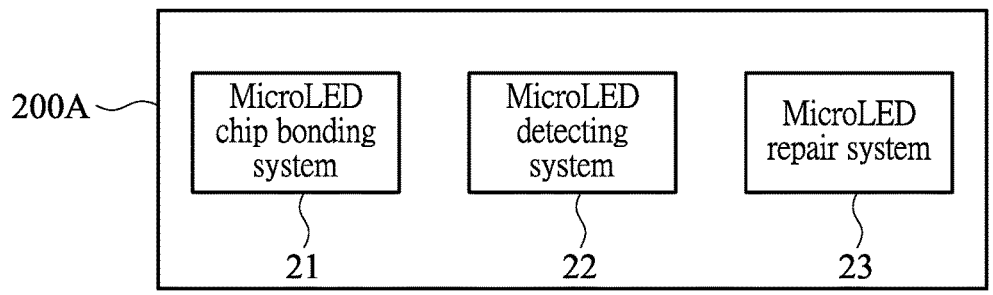
FIG. 4A shows a block diagram illustrating an integrated machine composed of a microLED chip bonding system, a microLED detecting system and a microLED repair system according to one embodiment of the present invention.

FIG. 4A shows a block diagram illustrating an integrated machine 200A composed of a microLED chip bonding system 21, a microLED detecting system 22 and a microLED repair system 23 according to one embodiment of the present invention. After microLEDs are bonded on a block 11, detection may be immediately performed on that block 11, followed by repairing defective microLEDs if any defective microLEDs have been detected. Accordingly, process of manufacturing the microLED display panel 100 may be greatly simplified and performance thereof may be substantially increased.

Figure 4B:
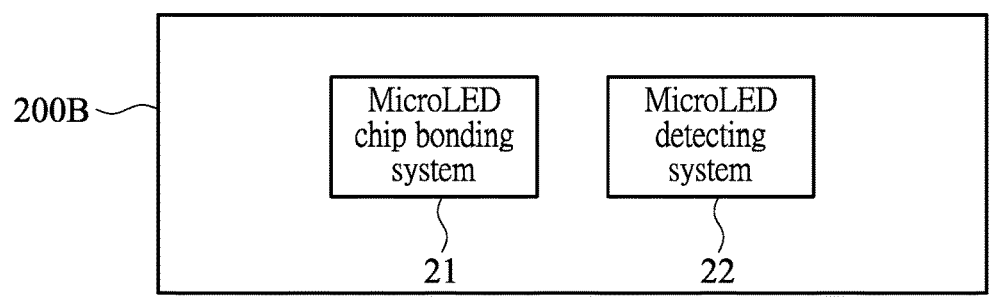
FIG. 4B shows a block diagram illustrating an integrated machine composed of a microLED chip bonding system and a microLED detecting system.
Figure 4C:
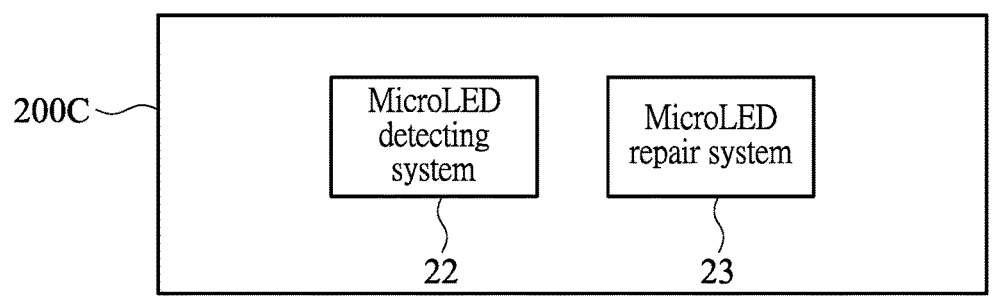
FIG. 4C shows a block diagram illustrating an integrated machine composed of a microLED detecting system and a microLED repair system.
Figure 4D:
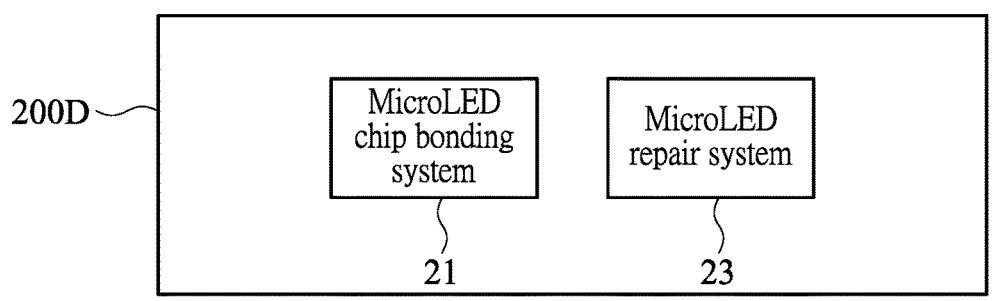
FIG. 4D shows a block diagram illustrating an integrated machine composed of a microLED chip bonding system and a microLED repair system.

Although the microLED chip bonding system 21, the microLED detecting system 22 and the microLED repair system 23 are incorporated in the integrated machine 200A in the embodiment, it is appreciated that, in other embodiments, only two of the three systems may be selected and incorporated in an integrated machine. FIG. 4B shows a block diagram illustrating an integrated machine 200B composed of a microLED chip bonding system 21 and a microLED detecting system 22. FIG. 4C shows a block diagram illustrating an integrated machine 200C composed of a microLED detecting system 22 and a microLED repair system 23. FIG. 4D shows a block diagram illustrating an integrated machine 200D composed of a microLED chip bonding system 21 and a microLED repair system 23.

Figure 5A:
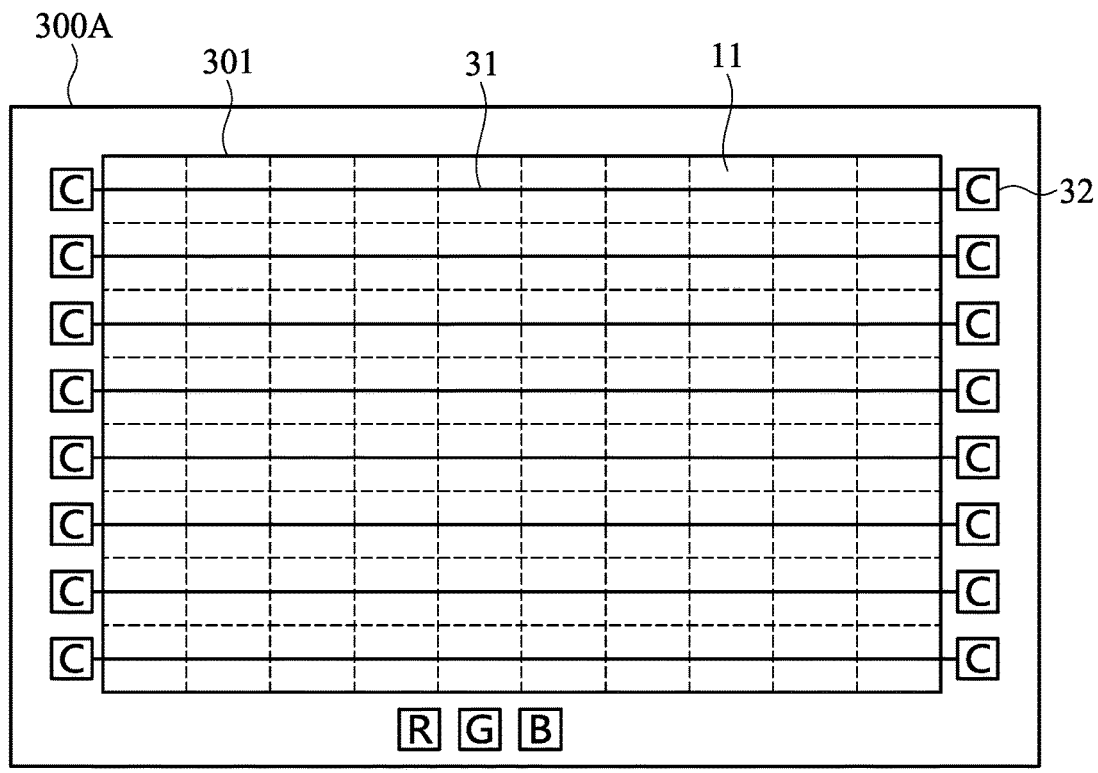
FIG. 5A and FIG. 5B show schematic diagrams respectively illustrating top views of microLED display panels without adopting aspects of the embodiments of the present invention.
Figure 5B:
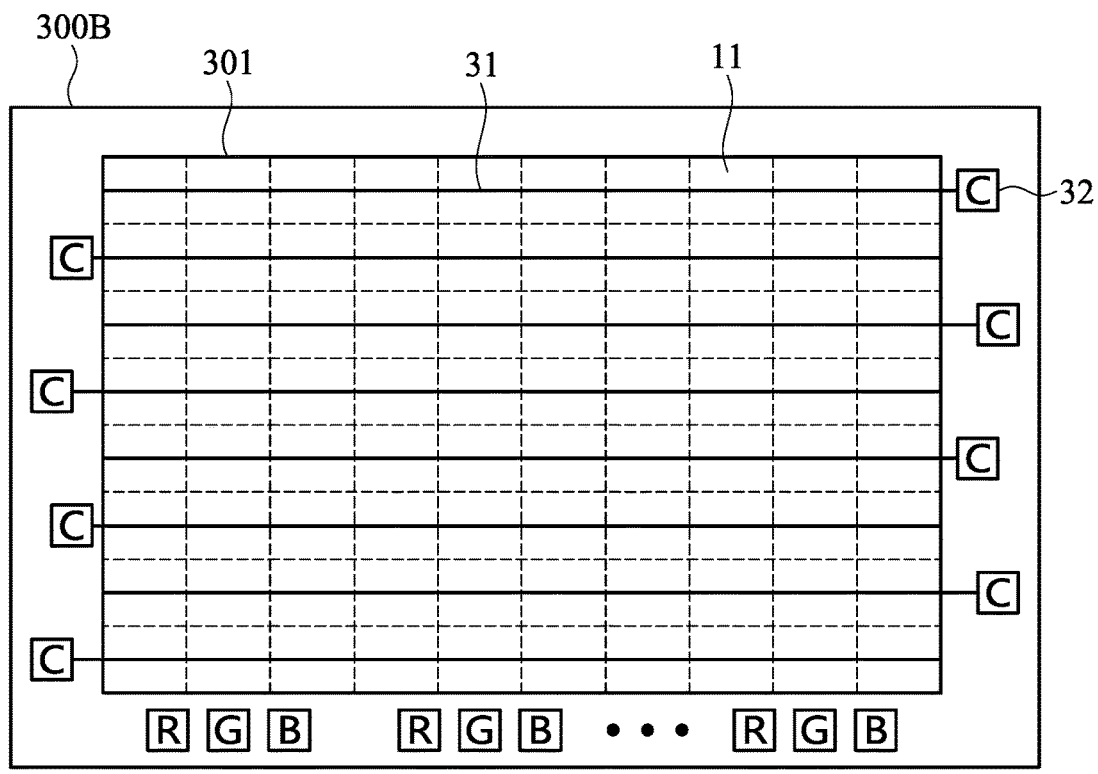

FIG. 5A and FIG. 5B show schematic diagrams respectively illustrating top views of microLED display panels 300A and 300B without adopting aspects of the embodiments of the present invention. Specifically, electric wires 31 are routed globally across the entire microLED display panel 300A/300B, and probe pads 32 are disposed outside the display area 301. As the impedance of the electric wires 31 is increasing along the length of the electric wires 31, microLEDs away from the probe pads 32 will be under driven with dimmed lightness. Moreover, as a large amount of microLEDs are driven at the same time, it is difficult to identify locations of abnormality. After finishing detection (and repair, if required), in addition to permanently severing the connection between the probe pads 32 and the display area 301, all junctions between any neighboring blocks 11 need also be severed permanently, for example, by laser cutting. While performing these laser cuttings, it is inevitable that some fault cuttings may occur and may probably cause the microLED display to malfunction.

Although specific embodiments have been illustrated and described, it will be appreciated by those skilled in the art that various modifications may be made without departing from the scope of the present invention, which is intended to be limited solely by the appended claims.

What is claimed is:

1. A micro-light-emitting diode (microLED) display panel, comprising:
    a plurality of microLEDs disposed on a display area, which is divided into a plurality of blocks;
    a plurality of drivers respectively disposed on the plurality of blocks; and
    a plurality of probe pads disposed within each block, the probe pads being electrically connected to corresponding microLEDs via corresponding electric wires;
    wherein the probe pads and the electric wires of a corresponding block are disposed locally and confined to the corresponding block, and are not connected elsewhere beyond the corresponding block;
    wherein same-color bonding pads at same columns are connected in the corresponding block, bonding pads of each column are connected to a corresponding compiling wire in the corresponding block before the compiling wire is connected to corresponding probe pad in the corresponding block.

2. The panel of claim 1, wherein the plurality of microLEDs comprise red microLEDs, green microLEDs and blue microLEDs.

3. The panel of claim 1, wherein the plurality of microLEDs comprise monochrome microLEDs with added fluorescent powder or quantum dots.

4. The panel of claim 1, wherein connection between the probe pads and the microLEDs of the corresponding block is permanently severed after finishing detection of the corresponding block.

5. The panel of claim 4, wherein the connection is severed by laser.

6. The panel of claim 1, wherein the probe pads are disposed on an edge of the corresponding block.

7. The panel of claim 1, wherein the probe pads are disposed on sides of the driver.

8. An integrated machine, comprising and integrating at least two of a micro-light-emitting diode (microLED) chip bonding system, a microLED detecting system and a microLED repair system adapted to a microLED display panel that comprises:
    a plurality of microLEDs disposed on a display area, which is divided into a plurality of blocks;
    a plurality of drivers respectively disposed on the plurality of blocks; and
    a plurality of probe pads disposed within each block, the probe pads being electrically connected to corresponding microLEDs via corresponding electric wires;
    wherein the probe pads and the electric wires of a corresponding block are disposed locally and confined to the corresponding block, and are not connected elsewhere beyond the corresponding block;
    wherein same-color bonding pads at same columns are connected in the corresponding block, bonding pads of each column are connected to a corresponding compiling wire in the corresponding block before the compiling wire is connected to corresponding probe pad in the corresponding block.

9. The machine of claim 8, wherein the plurality of microLEDs comprise red microLEDs, green microLEDs and blue microLEDs.

10. The machine of claim 8, wherein the plurality of microLEDs comprise monochrome microLEDs with added fluorescent powder or quantum dots.

11. The machine of claim 8, wherein connection between the probe pads and the microLEDs of the corresponding block is permanently severed after finishing detection of the corresponding block by the microLED detecting system.

12. The machine of claim 11, wherein the connection is severed by laser.

* * * * *